US009954327B1

(12) United States Patent
Barber et al.

(10) Patent No.: US 9,954,327 B1
(45) Date of Patent: Apr. 24, 2018

(54) MODULAR PCB HOUSING WITH GROUNDING CLIP

(71) Applicant: PHOENIX CONTACT DEVELOPMENT AND MANUFACTURING, INC., Middletown, PA (US)

(72) Inventors: Terry Lee Barber, Harrisburg, PA (US); Craig Alan Brodbeck, Lancaster, PA (US); Scott Michael Frye, Palmyra, PA (US); Talon Coe Kephart, Lancaster, PA (US); Stephen Craig Klinger, Hummelstown, PA (US); Matthew J. Wynn, Elizabethtown, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 15/562,582

(22) PCT Filed: Nov. 10, 2015

(86) PCT No.: PCT/US2015/059824
§ 371 (c)(1),
(2) Date: Sep. 28, 2017

(87) PCT Pub. No.: WO2016/164070
PCT Pub. Date: Oct. 13, 2016

Related U.S. Application Data

(60) Provisional application No. 62/145,233, filed on Apr. 9, 2015.

(51) Int. Cl.
*H01R 12/00* (2006.01)
*H01R 25/14* (2006.01)
(Continued)

(52) U.S. Cl.
CPC ............. *H01R 25/142* (2013.01); *H01R 4/64* (2013.01); *H05K 5/0004* (2013.01); *H05K 5/0021* (2013.01)

(58) Field of Classification Search
CPC H01R 13/6558; H01R 29/00; H01R 2201/26; H01R 25/142; H01R 9/24; H01R 9/26; H01R 13/514
(Continued)

(56) References Cited

U.S. PATENT DOCUMENTS 5,629,831 A  5/1997  Eggert et al.
5,741,142 A  4/1998  Dux et al.
(Continued)

OTHER PUBLICATIONS

European Patent Office, International Search Report in corresponding PCT/US2015/59824, 11 pages, dated Feb. 17, 2016.

*Primary Examiner* — Phuong Chi T Nguyen
(74) *Attorney, Agent, or Firm* — Hooker & Habib, P.C.

(57) ABSTRACT

A housing slice for forming a modular housing for mounting an electrical component on a grounding rail carries a grounding member for grounding the electrical component to the grounding rail. The grounding member extends outside of the housing slice but does not extend beyond the sides of the housing slice to permit side-by-side stacking of the housing slice carrying the grounding member with other housing slices with or without grounding members.

21 Claims, 12 Drawing Sheets

(51) Int. Cl.
*H05K 5/00* (2006.01)
*H01R 4/64* (2006.01)

(58) Field of Classification Search
USPC .... 439/76.1, 94, 44, 49, 76.2, 716, 717, 709
See application file for complete search history.

(56) References Cited

U.S. PATENT DOCUMENTS

| | | | |
|---|---|---|---|
| 7,101,231 B2 * | 9/2006 | Prokup | H01R 4/4809 439/709 |
| 7,537,496 B2 * | 5/2009 | Bentler | H01R 9/2491 439/532 |
| 7,753,739 B2 * | 7/2010 | Bentler | H01R 9/2491 439/532 |

* cited by examiner

MODULAR PCB HOUSING WITH GROUNDING CLIP

FIELD OF THE DISCLOSURE

The disclosure relates to housings that mount electrical components onto a grounding rail, and in particular, to housings that carry a conductive grounding member that grounds the electrical component to the grounding rail.

BACKGROUND OF THE DISCLOSURE

Terminal grounding structures composed of insulated housings that enclose metal grounding members are known. The housing is typically made of plastic and is dedicated to housing the metal grounding member. The housing and the grounding member are intended to be mounted on an elongate metal grounding rail such as a DIN rail. An end of the grounding member latches onto the rail when the housing is mounted on the rail. The other end of the grounding member is formed as an electrical terminal for connecting a wire or other conductor of an electrical circuit to ground the electrical circuit to the grounding rail. A number of housings can be mounted on the rail for grounding a number of different electrical circuits.

Examples of such terminal grounding structures are disclosed in Wu et al, U.S. Pat. No. 7,686,627 and Wu U.S. Pat. No. 7,922,521.

Yet other housings include pre-formed electrical connector halves carried in the housings that mate with corresponding connector halves of electrical components to form electrical connections. The housing connector half includes pins or sockets that cooperate with matching sockets or pins of the electrical component to form electrical connections. Some of the pins or sockets of the housing connector half are electrically connected to a grounding member carried in the housing to form a ground connection between the electrical component and the grounding rail in addition to the other electrical connections. The relative locations of the connector half of the electronic component is fixed by the location of the connector half in the housing.

An example of such a housing is disclosed in Phoenix Contact GmbH & Co. DE 4303717 A1.

Other housings are designed for carrying electronic components such as printed circuit boards (PCBs). An example is the UM-PRO™ housing sold by the applicant and shown in FIG. 24. The housing has a housing body 210 having opposed, elongate profile rails 212, 214 that support opposite edges of a PCB 216. End covers 218, 220 attach to the ends of the housing body and include feet (not shown) that mount the housing to a DIN rail. One or both of the end covers 218, 220 can carry a grounding clip (not shown). The grounding clip is formed as a spring clamp that grips a flange of the DIN rail and includes an electrical terminal for electrical connection to a grounding terminal of the PCB. A grounding screw 222 is shown connecting the electrical terminal of a grounding clip carried by the end cover 218 to the grounding terminal of the PCB.

Because the ground clip is mounted at an end of the housing, the grounding terminal of the PCB carried by the housing 210 is required to be adjacent to an end of the housing.

Yet other housings for electrical components utilize a modular housing in which the housing is formed from discrete housing modules or "slices", each slice having a relatively thin thickness. The slices are mounted side by side to form a stack of housing slices that are mounted on the grounding rail. The slices are relatively thin along the stack, and so housings can be formed to receive electronic components of different lengths by varying the number of slices. The relatively thin slice thickness results in minimal wasted space along the rail. End covers close the exposed sides of the housing slices at the ends of the stack.

Each housing slice includes contact terminals and electrical conductors extending from the terminals that form electrical connections with corresponding contacts or vias on a portion of the electronic component adjacent the housing terminals. An examples of such a modular housing is disclosed in Correll, U.S. Pat. No. 7,462,063 "Modular Terminal Block", which patent is owned by the applicant and is incorporated by reference as if fully set forth herein.

BRIEF SUMMARY OF THE DISCLOSURE

The inventors have discovered that it would be desirable to provide a modular housing for mounting an electronic component to a grounding rail utilizing a modular housing structure that can provide one or more grounding members in which the one or more grounding members are not required to always be in fixed in the same position with respect to the housing as are found in the conventional housings discussed above.

Disclosed is a modular housing for mounting an electronic component to a grounding rail in which some or all of the housing slices are configured to carry a grounding member without mechanical interference with adjacent housing slices. The one or more housing slices that carry grounding members can be located anywhere along the modular housing as needed to form grounding connections between the electronic component and the grounding rail.

In an embodiment, the modular housing is formed from a first set of housing slices that are each configured to be capable of carrying a grounding member and a second set of conventional housing slices that are each not configured to carry a grounding member. Housing slices from either set can be located side-by-side with one another to form a stack of housing slices. Housing slices carrying grounding members can be placed where needed along the stack to selectively locate grounding members in the stack.

In an alternative embodiment, the modular housing is formed from housing slices that are each configured to be capable of carrying a grounding member. Any housing slice that is not required to carry a grounding member for forming ground connections between the electronic component and the grounding rail does not carry a grounding member.

In an embodiment, the housing slice is formed as a two-component housing slice, the housing slice having an integral contact body member and an integral extender body member. The extender body member carries the grounding member.

In an embodiment the housing slice is configured to form a modular housing for carrying a PCB and includes a first support for supporting a first edge of the PCB and a second support for supporting a second edge of the PCB spaced away from the first edge.

In embodiments the grounding member includes a first, lower end gripping portion configured to engage a grounding rail, a second, upper end electrical terminal, and a conductor bar or electrical lead joining the gripping and terminal portions. The terminal is located above the housing slice and is substantially centered between the sides of the housing sliced along a transverse axis of the housing slice that is perpendicular to the grounding rail axis when the housing slice is mounted on the rail.

The portion of the grounding clip within the housing slice, in an embodiment, essentially forms part of one side of the housing slice that faces an adjacent housing slice or end cover of a housing module formed with the housing slice.

In yet further embodiments, a housing slice that is configured to carry a grounding clip includes retention arms or latch arms that extend away from one side of the housing and secure the grounding clip against a support surface formed on the housing slice. The latch arms extend into a recess or cavity space in the facing side of an adjacent housing slice or end cover.

A stack of housing slices for a modular housing formed all or in part from the disclosed housing slices provides the electrical designer greater flexibility in designing a modular housing to carry a specific electronic component such as a PCB, and also provides greater flexibility in designing electronic components to be carried by the modular housing. The designer can selectively place a grounding member in any one or more of the housing slices along the stack, enabling modular housings to carry existing electronic components that do not have ground connections near the ends of the components. New electronic component designs can be created to be carried by a modular housing with ground connections not limited to the ends of the board. With the ability to tailor the modular housing to adapt to the electronic component, ground connections can be provided where optimal or otherwise convenient on the electronic component.

Other objects and features will become apparent as the description proceeds, especially when taken in conjunction with the accompanying drawing sheets illustrating one or more embodiments.

DETAILED DESCRIPTION

Figure 1:
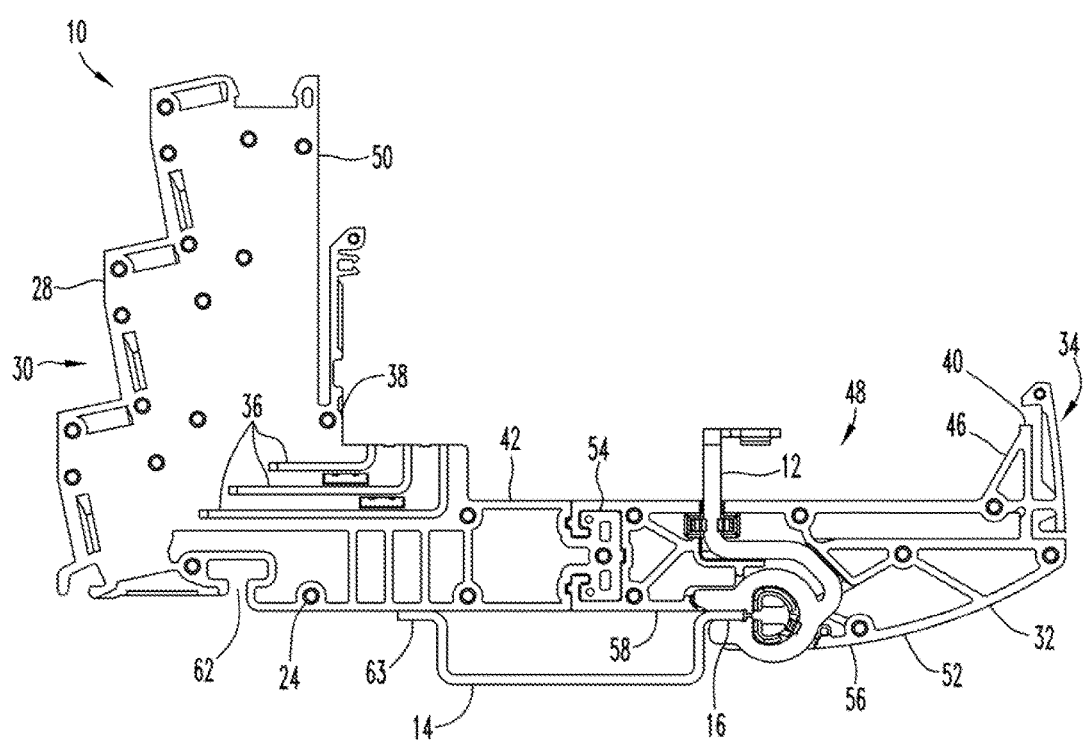
FIG. 1 is a front view of a two-component housing slice carrying a grounding clip, the housing slice mounted on a DIN rail.
Figure 2:
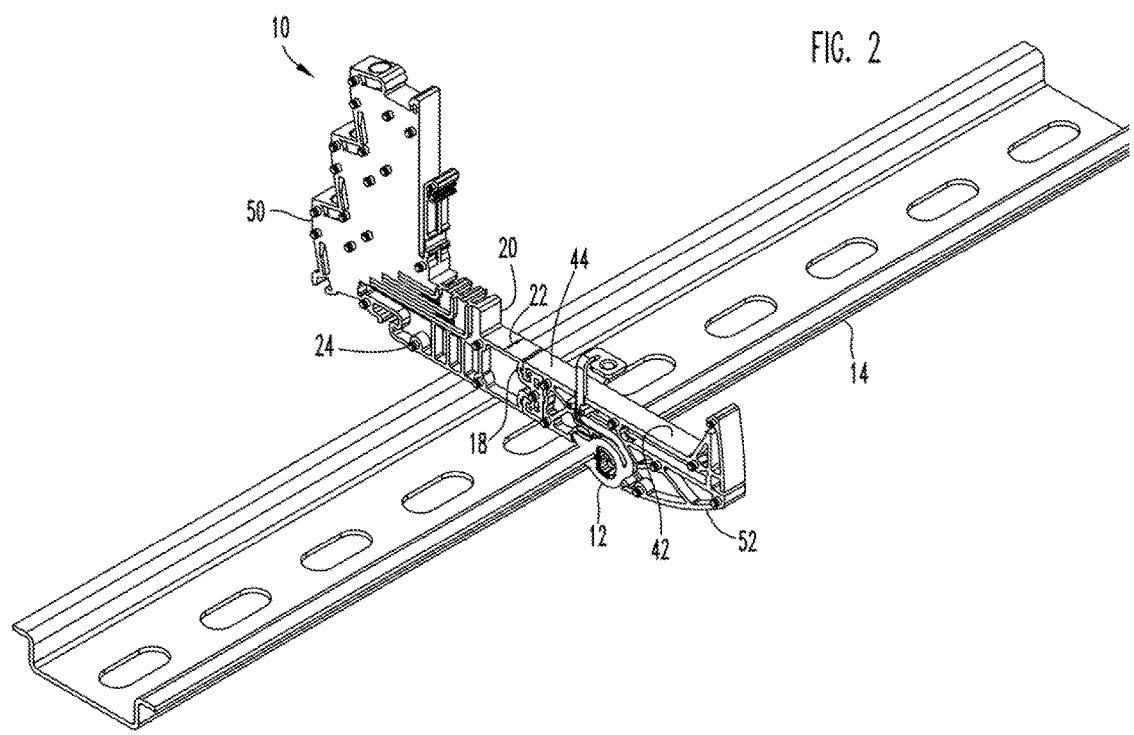
FIG. 2 is an oblique view of the housing slice and grounding clip mounted on the DIN rail.

A housing slice 10 for forming part of a modular housing for mounting an electrical component on a grounding rail is shown in FIGS. 1 and 2. The housing slice 10 is similar to the housing slice disclosed in the Correll '063 patent and so conventional features of the housing slice will not be described in detail.

The housing slice 10 carries a grounding member formed as a grounding clip 12. The housing slice 10 is intended to be mounted on a DIN rail with the grounding clip 12 engaging a flange of the DIN rail. FIGS. 1 and 2 illustrate the housing slice 10 mounted on a DIN rail 14 with the grounding clip 12 gripping a DIN rail flange 16.

Figure 8:
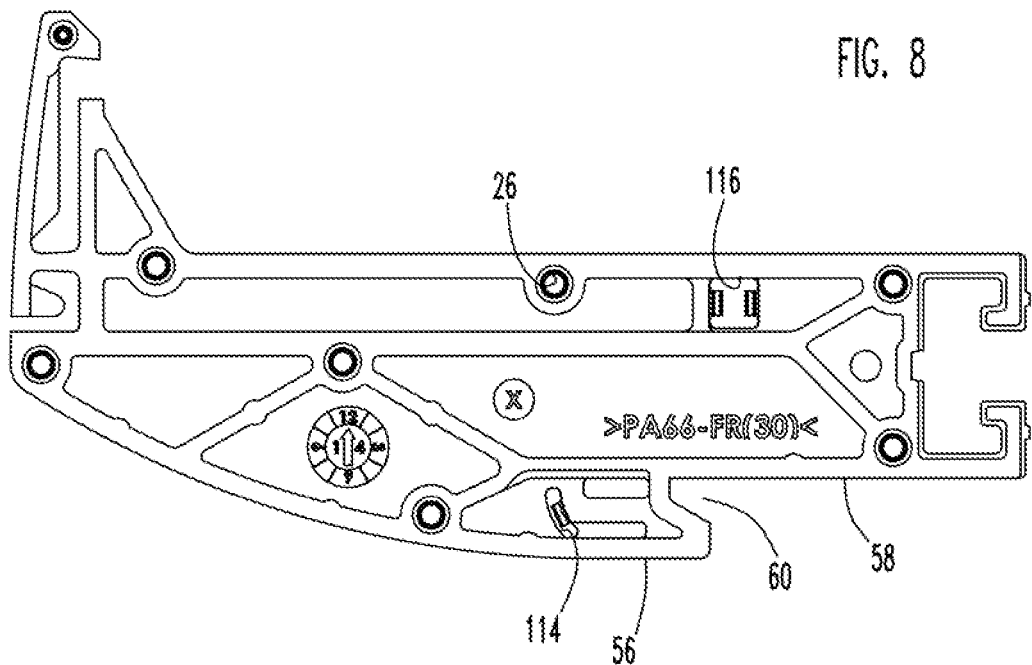
FIG. 8 is a back view of the extender body member.
Figure 9:
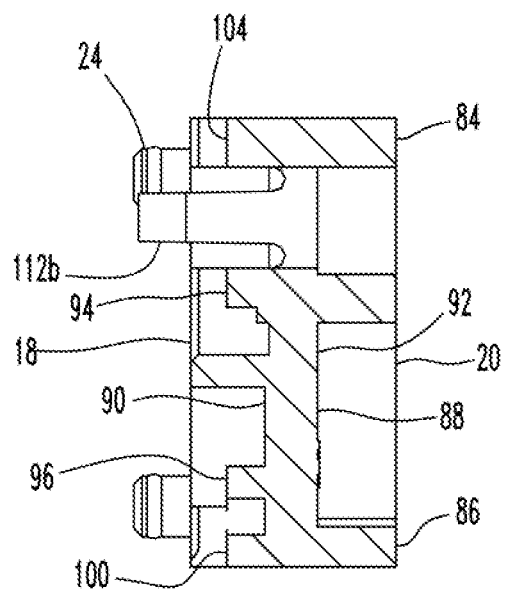
FIG. 9 is a vertical sectional view taken through the extender body member.
Figure 10:
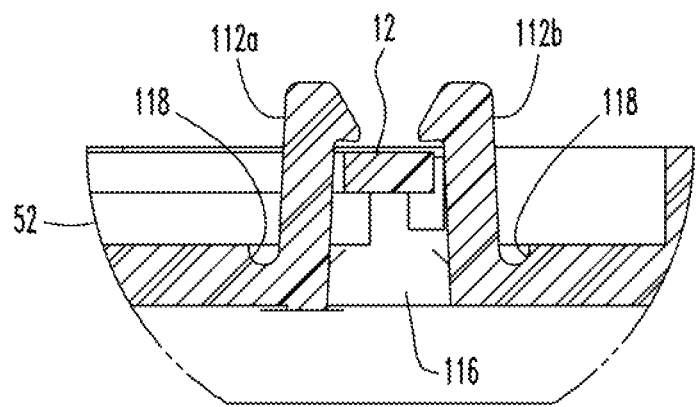
FIG. 10 is an enlarged horizontal sectional view of a portion of the extender body member.

The housing slice 10 has opposite and parallel sides 18, 20 separated by a housing thickness 22 defining the width of the slice 10. Alignment pins 24 extend away from the side 18 and corresponding blind holes 26 (see FIG. 8) configured to receive alignment pins are disposed on the side 20 to orient and form non-rotatable connections between adjacent housing slices in the conventional manner. The housing slice 10 includes a contact body portion 28 located on an input/output side 30 and an extender body portion 32 located on an electronic component side 34 of the housing slice 10.

The contact body portion 28 has walls 36 that define channels for receiving formed metal leads or conductors (not shown) that extend from respective contact terminals (not shown) carried by the contact body portion 28 to the electronic component held by the housing module.

The extender body portion 32 cooperates with the contact body portion 28 in supporting the electronic component. A first component support 38 located adjacent to the input/output side 30 extends across the full width of the slice from the housing side 18 to the housing side 20. A second component support 40 located adjacent to the electronic component side 34 and spaced from the first support 38 extends across the full width of the slice from the housing side 18 to the housing side 20. A floor 42 extends between and below the first and second component supports 38, 40 and also extends across the full width of the slice. The floor 42 includes a generally flat, planar upper surface 44 that extends from the contact leads to a post 46 adjacent the component side 34 of the slice 10. The post 46 spaces the second component support 40 above the floor surface 44.

The housing slice 10 is intended to form part of a housing module that supports a printed circuit board (PCB). The supports 38, 40 are configured to support respective edges of the PCB in a conventional manner, with the spacing between the supports 38, 40 selected to accommodate the width of the PCB. The supports 38, 40 cooperate with the floor 42 to define a recess 48 for receiving the PCB itself and components mounted on the underside of the PCB facing the floor 42.

The illustrated housing slice 10 has the contact body portion 28 formed as an integral contact body member 50 and the extender body portion 32 formed as a separate integral extender body member 52. The contact body member 50 and the extender body member 52 are joined together by a press-fit engagement 54. This two-piece body construction is disclosed in Barber et al. U.S. Pat. No. 8,715,017 owned by the applicant herein and so will not be described in detail.

The first component support 38 is carried by the contact body member 50 and the second component support 40 is carried by the extender body member 52. The two-piece body construction enables the same contact body member 50 to be used with different extender body members to space apart the supports 38, 40 as required to accommodate PCBs of different widths as explained in the '017 patent.

The extender body member 52 carries the grounding clip 12 and includes a bottom projection or nose 56 extending away from the electronic component side 34. The nose 56 is spaced from a generally flat bottom surface 58 that extends across a flange of the DIN rail when the housing module is mounted on the DIN rail. The nose 56 and the bottom surface 58 define a recess 60 (see FIG. 8) between them to receive a DIN rail flange such as the flange 16 shown in FIG. 1. The grounding clip 12 is aligned with the recess 60 to also engage and make electrical contact with the DIN rail flange when a DIN rail flange is received in the recess 60.

The contact body member 50 includes a through-slot 62 open at the bottom of the member. The slots 62 of the housing module slices cooperate to receive a conventional DIN rail latch (not shown) that latches the housing module to a DIN rail flange such as the DIN rail flange 63 shown in FIG. 1.

Figure 3:
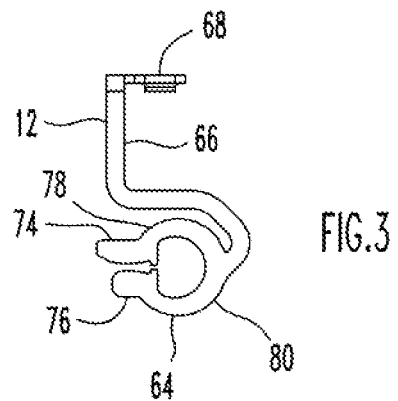
FIG. 3 is a front view of the grounding clip shown in FIG. 1.
Figure 4:
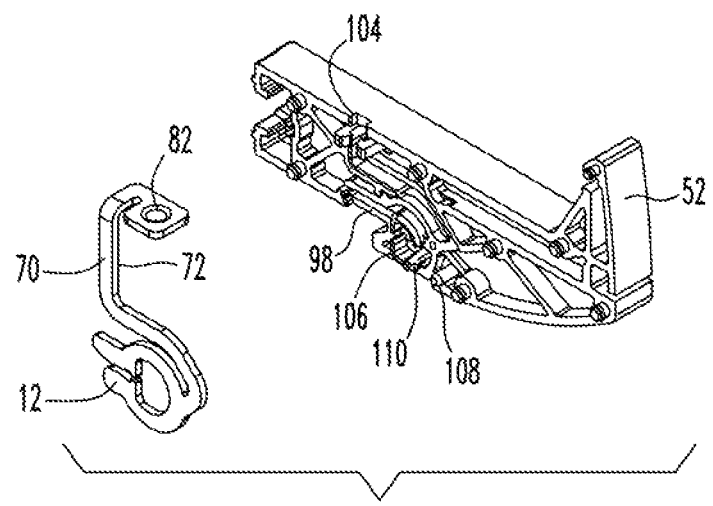
FIG. 4 is an exploded oblique view of the grounding clip and the extender body member component of the housing slice shown in FIG. 1.
Figure 5:
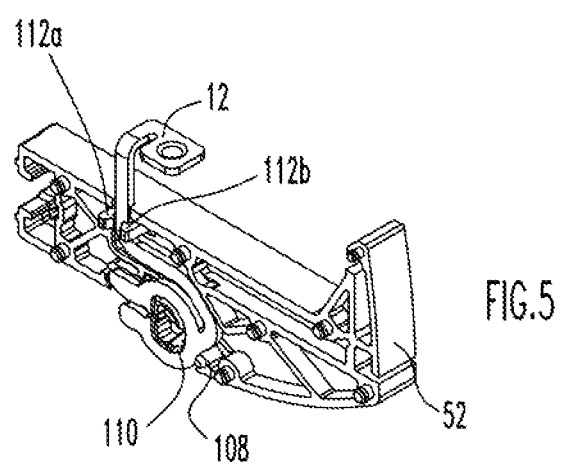
FIG. 5 is similar to FIG. 4 but illustrates the grounding clip being carried by the extender body member.
Figure 6:
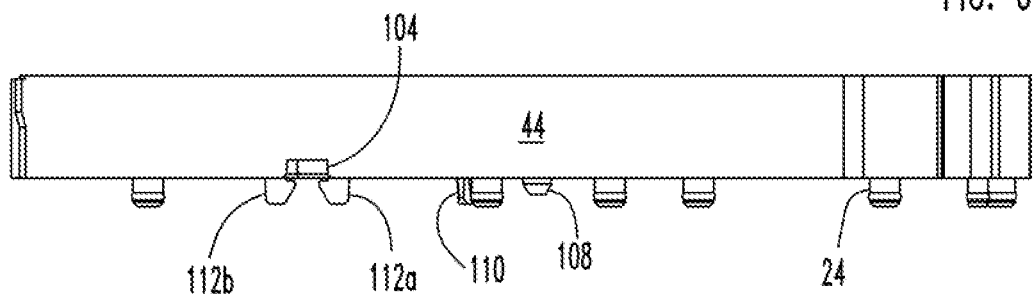
FIG. 6 is a top view of the extender body member.
Figure 7:
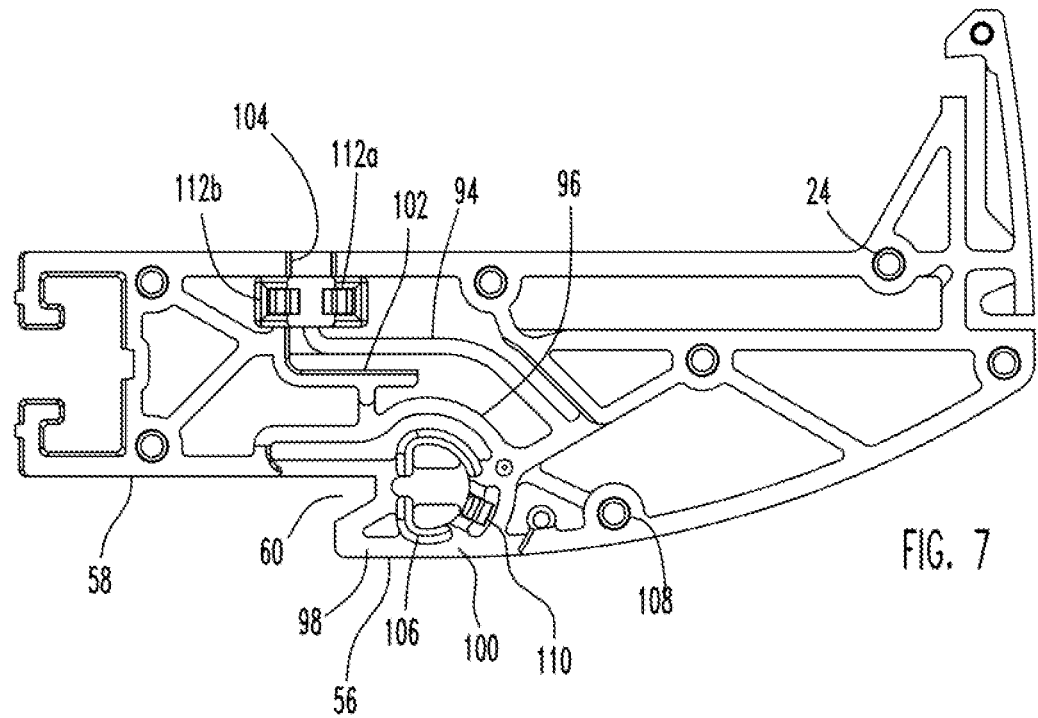
FIG. 7 is a front view of the extender body member.

FIG. 3 illustrates the grounding clip 12, and FIGS. 4 and 5 illustrate the extender body member 52 and the grounding clip 12. FIGS. 6-10 illustrate only the extender body member 52.

The grounding clip 12 is a one-piece member stamped from flat metal sheet and includes a grounding portion 64 that engages the DIN rail, an elongate formed conductor lead portion 66 extending from the grounding portion 64, and an electrical terminal 68 attached to the free end of the lead portion 66 away from the grounding portion 64. The grounding portion 64 and the lead portion 66 are flat and co-planar and have opposite outer and inner sides 70, 72 respectively. The grounding portion 64 is conventionally shaped and includes closely spaced, elongate upper and lower grip jaws 74, 76 carried on respective spring arms 78, 80. The lead portion 66 extends away from the spring arms to the electrical terminal 68. The illustrated electrical terminal 68 is a generally flat screw terminal having a threaded through-hole 82.

The extender body member 52 is an inject-molded plastic member formed generally as an elongate "I-beam" extending axially away from the component side 34 with a top flange 84 defining the extender body member portion of the floor 42, a bottom flange 86 defining the nose 56 and the bottom surface 58, and a web 88 centered between and connecting the top and bottom flanges 84, 86. The web 88 has opposed flat, parallel sides 90, 92 spaced inwardly from the respective slice sides 18, 20. Alignment pins 24 extend from and corresponding pin holes 26 extend towards respective web sides 90, 92.

As shown in FIGS. 4 and 5, the grounding clip 12 is received in a cavity formed in the extender body member 52 adjacent to the web side 90 and with the inner clip side 72 adjacent the web side 90. Clip support walls 94, 96 extend from the web side 90. The top of the walls 94, 96 are flat and abut the inner clip side 72 to locate the outer clip side 70 flush with the side 18. An elongate cutout 98 along the bottom flange 86 on the side 18 has a depth equal to the clip thickness and defines a support surface 100 that assists the clip support walls 94, 96 in positioning the clip 12 flush with the side 18 while exposing the clip jaws 74, 76 to the recess 60. A support wall 102 extends from the web side 90 and is shaped to engage and support the clip conductor lead 66 in the cavity.

The grounding clip 12 is held in the extender body member 52 with the clip jaws 74, 76 in the recess 60 to receive a DIN rail flange. The clip lead portion 66 extends through a slot 104 formed in the top flange 84 to locate the electrical terminal 68 in the PCB recess 48 as shown in FIG. 1. The slot 104 extends through the thickness of the top flange 84 and is open to the slice side 18. The slot 104 has a generally rectangular cross section and is sized to closely receive the portion of the lead portion 66 passing through the slot 104.

The clip 12 and the extender body member 52 have additional features that non-rotatably connect the clip and the extender body member when the clip is in the cavity. The clip spring arms 78, 80 define a generally "D" shaped opening that receives a corresponding "D" shaped wall 106 extending from the web side 90. The "D" wall 106 orients the clip 12 such that the clip jaws 74, 76 are aligned with the recess 60 to receive a DIN rail flange. A lead support post 108 extends from the web side 90 near the wall 106 to support the lead portion 66 where it extends from the grounding portion 64. The lead support post 108 also assists in resisting angular displacement of the clip 12.

The extender body member 52 has yet additional features that retain the grounding clip 12 in the body member cavity. The "D" wall 106 is formed in part by a latch arm 110 that releasably engages the clip grounding portion 64. A pair of latch arms 112a, 112b immediately below the slot 104 releasably engage the clip lead portion 66. The latch arm 110 extends from a wall defining a through hole 114 in the web 88. The latch arms 112a, 112b extend from opposite sides of a wall defining a through hole 116 in the web 88. A portion of the wall adjacent each latch arm 110, 112 forms an undercut neck 118 (see FIG. 10) that locates the respective latch arm in its through hole.

FIGS. 1, 2, and 5 illustrates the positioning of the clip electrical terminal 68 with respect to the extender body member 52 when the grounding clip 12 is carried by the member 52. The terminal 68 is centered over the floor 42 parallel with the floor surface 44 and does not extend beyond the sides of the extender body member 52. The height of the terminal 68 above the floor surface 44 and the lateral position of the terminal 68, that is, the axial distance away from the PCB support 40, is selected to place the terminal 68 directly under and closely spaced from a grounding terminal of the PCB carried by the housing module.

As shown in FIG. 1, the position of the grounding portion 64 in the housing slice 10 is determined by the size and relative position of the DIN rail flange 16 when the housing slice 10 is mounted on the DIN rail. The position of the grounding terminal 68 with respect to the housing slice 10 is determined by the relative position of the grounding terminal of the PCB board when held by the housing module. The lead 66 positions the grounding terminal 68 with respect to the grounding portion 64 as needed to correctly position the grounding terminal 68 under the grounding terminal of the PCB board when the housing slice 10 is forming part of the housing module.

Figure 11:
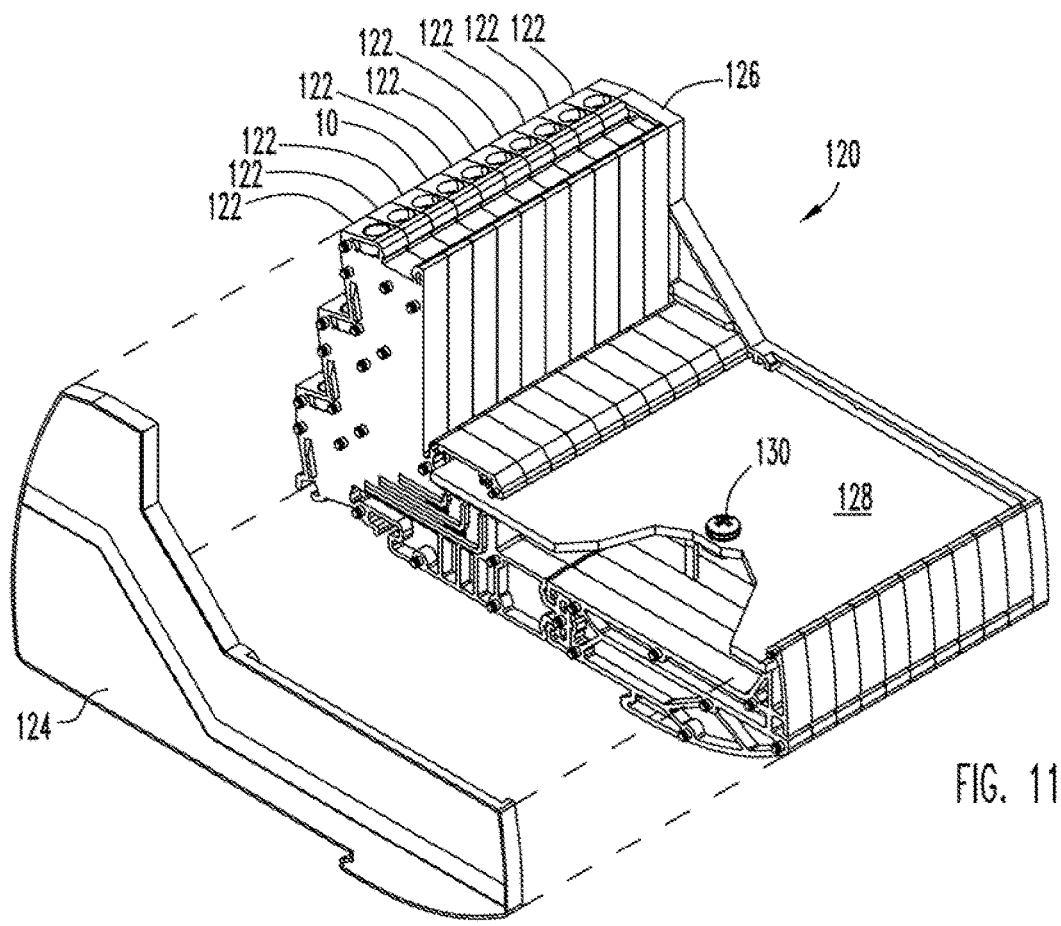
FIG. 11 is an oblique, partially exploded view of a housing module formed from housing slices that include the housing slice with grounding clip shown in FIG. 1 sandwiched between two conventional housing slices that are not configured to carry grounding clips.
Figure 12:
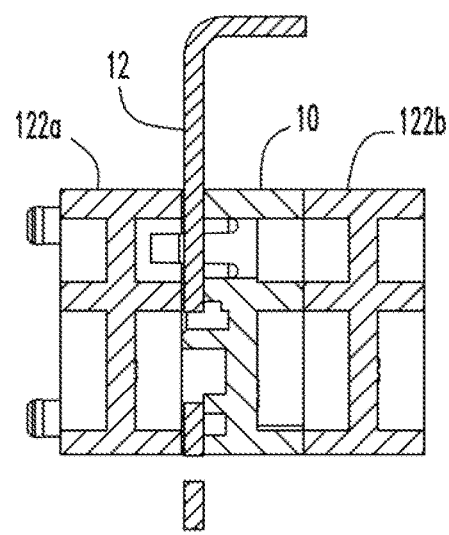
FIG. 12 is a sectional view of the housing slice shown in FIG. 1 being sandwiched between an adjacent pair of conventional housing slices of the housing module shown in FIG. 11.

FIGS. 11 and 12 illustrate the housing slice 10 forming part of a housing module 120 (to simplify the drawing, FIG. 11 does not show conductors or a DIN rail latch). The housing module 120 is formed from a stack of housing slices mounted side-by-side, the housing slices including the housing slice 10 and a number of like, conventional housing slices 122. A pair of end covers 124, 126 cover the exposed ends of the stack next to the slices 122 on the outside of the stack.

The housing slice 10 is sandwiched between an adjacent pair of interior housing slices 122 (labeled as housing slice 122a and 122b in FIG. 12) away from the end plates 124, 126. The housing slice 122a adjacent to the side 18 of the housing slice 10 receives the alignment pins 24 of the housing slice 10. The holes 26 of the housing slice 10 receive the alignment pins of the housing slice 112b adjacent to the side 20 of the housing slice 10.

As shown in FIG. 11, the grounding clip 12 is held between the slice 10 and the adjacent side of the slice 122a. The outer surface of the portions of the grounding clip 12 located in the slot 104 and the bottom flange cutout 98 form portions of the side 18 of the housing slice 10. The latch arms 110, 112a, 112b and the support post 108 do not extend beyond the alignment pins 24 of the slice 10 and are received in the space adjacent the web 88a of the housing slice 122a. There is no mechanical interference of the latch arms 100, 102a, 102b, support post 108, and the grounding clip 12 with the adjacent housing slice 122a.

The housing slice 10 is the only housing slice carrying a grounding member, that is, the housing slices 122 of the housing module 120 are conventional housing slices and are not designed to carry a grounding clip 12.

The housing module 120 is shown carrying a PCB 128. The housing module 120 positions a grounding terminal (not shown) of the PCB 128 directly over the electrical terminal 68. A grounding screw 130 electrically and mechanically connects the grounding terminals of the grounding clip 12 and the PCB 128 together in a conventional manner.

Figure 13:
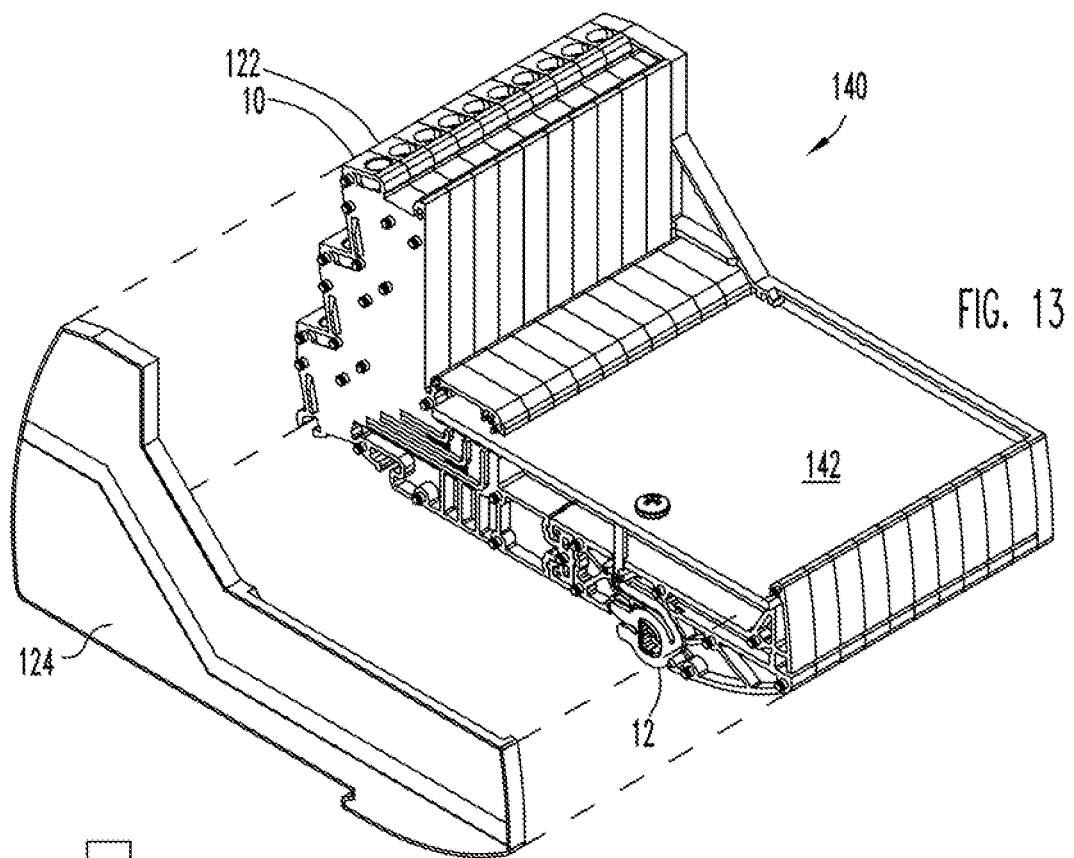
FIG. 13 is an oblique, partially exploded view of a second embodiment housing module similar to the housing module shown in FIG. 11 but with the housing slice with the grounding clip adjacent an end cover of the housing module.
Figure 14:
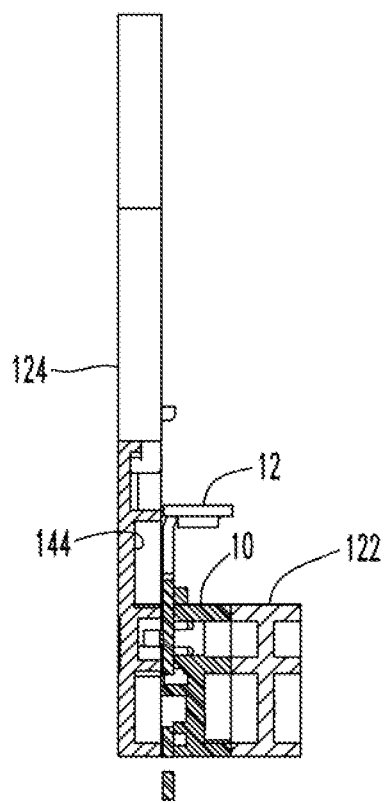
FIG. 14 is a sectional view of the housing slice shown in FIG. 1 being sandwiched between an end cover and a conventional housing slice of the modular housing shown in FIG. 14.

FIGS. 13 and 14 illustrate a module housing 140 formed from the same slices 10 and 122 as the module housing 120 but carrying a PCB 142 having a grounding terminal that requires the housing slice 10 be located adjacent the outer side of the stack next to the end cover 124. The end cover 124 has conventional blind holes to receive the alignment pins 24 of the housing slice 10 and provides sufficient clearance from the cover end wall 144 to receive the latch arms 110, 112a, 112b, and support post 108.

Housing modules 120, 140 are each illustrated as having a single housing slice 10. If the PCB or other electronic component carried by a housing module requires grounding of multiple grounding terminals, the housing module may replace one or more conventional housing slices 122 with the housing slices 10. The extender body member 52 of a housing slice 10 can receive the latch arms and support post of an adjacent housing slice 10 without interference so that pairs of housing slices 10 can be stacked side-by-side when forming a housing module.

Figure 15:
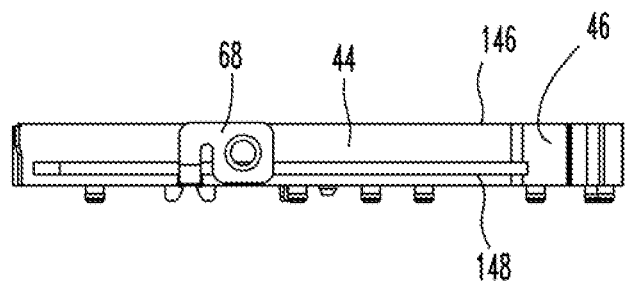
FIGS. 15-17 are top, oblique, and front views of a second embodiment extender body member carrying the grounding clip shown in FIG. 1.
Figure 16:
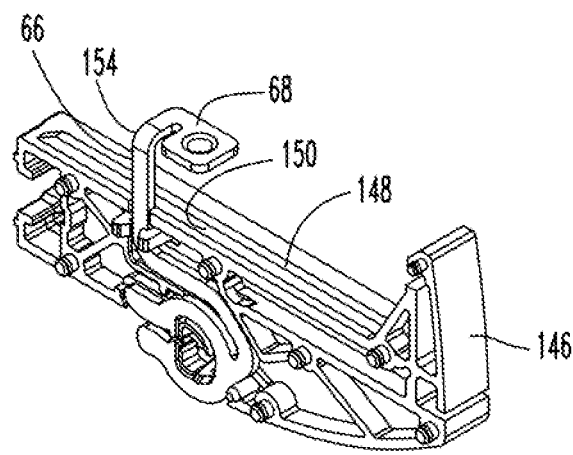
Figure 17:
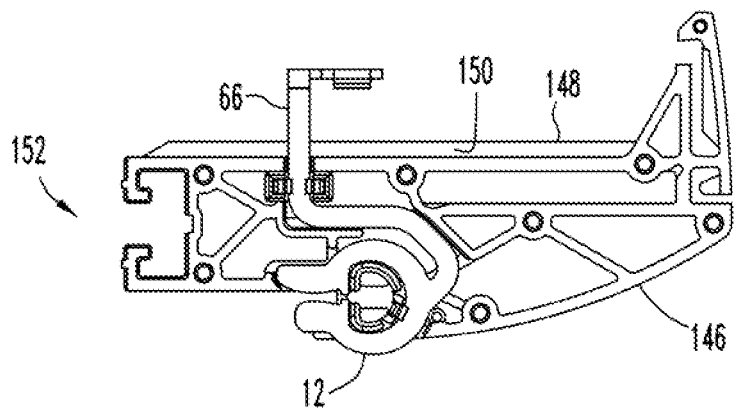

FIGS. 15-17 illustrate a second embodiment extender body member 146 for use with the contact body member 50 to form a housing slice similar to the housing slice 10. The extender body member 146 is similar to the extender body member 52 and so only differences will be discussed. Corresponding reference numbers will be used to identify like components.

The extender body member 146 includes a raised ridge 148 extending along the top of the top flange 84 immediately adjacent to the closed end of the slot 104. The ridge 148 extends parallel with the sides of the body member 146 and has a rectangular cross-section defining an abutment surface 150 facing the side 18 and perpendicular to the floor surface 44. The abutment surface 150 is immediately adjacent to the closed end of the slot 104 and extends from the post 46 to near the connection end 152 of the body member 146.

FIGS. 15-17 illustrate the body member 146 carrying a grounding clip 12. The lead portion 66 extends away from the slot 104 perpendicular to the floor surface 44 and extends in a straight line to a 90-degree bend 154 spaced above the floor surface 44 that is connected to the grounding terminal 68. The abutment surface 150 supports the lead portion 66 where it exits the slot 104.

The lead 66 includes laterally extending and vertically extending portions as needed to locate the grounding terminal in the proper location with respect to the housing slice 10. Different embodiment grounding members 12 carried by the housing slice 10 may have different shapes in order to place the grounding portion 64 in different positions with respect to the housing slice 10.

Figure 18:
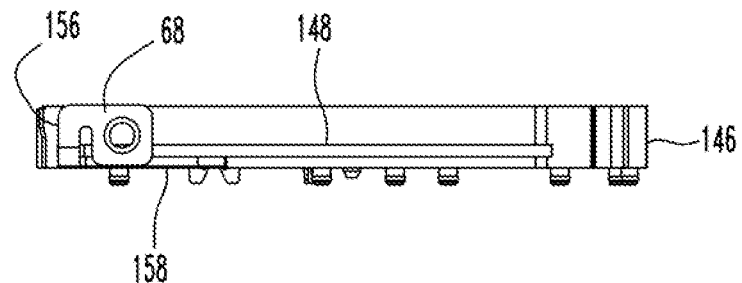
FIGS. 18-20 are similar to FIGS. 15-17 respectively but with the extender body member carrying a second embodiment grounding clip.
Figure 19:
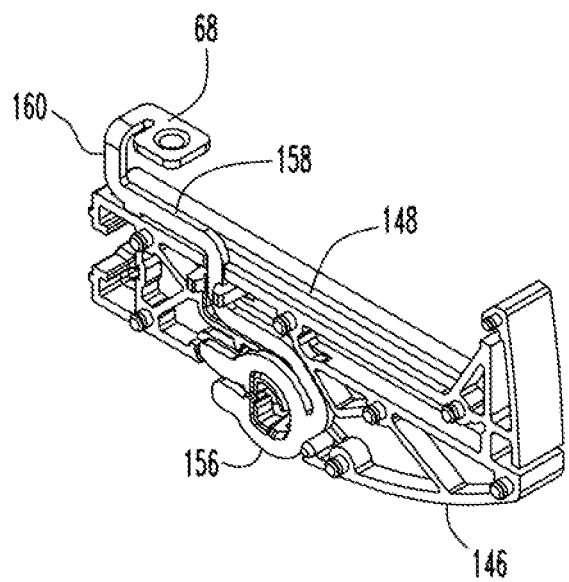
Figure 20:
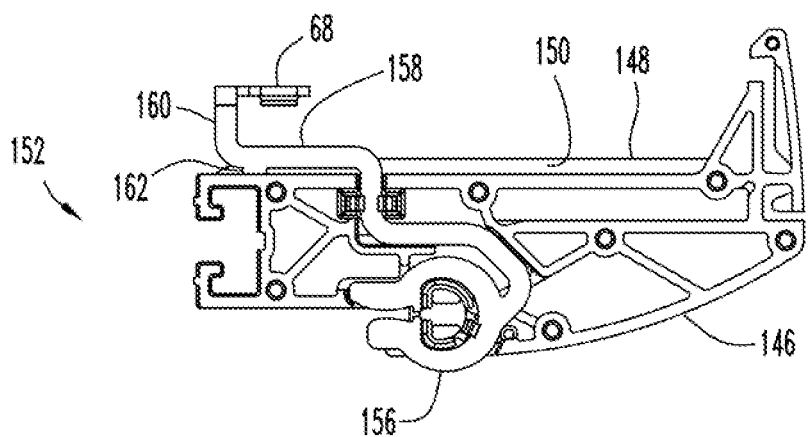

FIGS. 18-20 illustrate the body member 146 carrying a second embodiment grounding clip 156. The grounding clip 156 is similar to the grounding clip 12 and so only differences will be discussed.

The grounding clip 156 is designed to locate the grounding terminal 68 closer to the input/output side 30 of the housing slice 10 than does the grounding clip 12. The lead portion of the grounding clip 156 exiting the slot 104 makes an immediate 90-degree bend towards the connection end 152 of the body member 146 and includes a lateral arm 158 and a vertical arm 160, both arms located on the outside of the body member 146. The lateral arm 158 extends adjacent to and parallel with the abutment surface 150 from the slot 104 to the vertical arm 160 to establish the lateral position of the grounding terminal 68. The abutment surface 150 does not extend vertically beyond the upper side of the lateral arm 158. The vertical arm 160 fixes the vertical position of the electrical terminal 68 above the recess floor 42.

The lateral arm 158 further includes an abutment member 162 near the vertical arm 160 that engages the floor surface to maintain the lateral arm 158 parallel with the floor surface 44.

Figure 21:
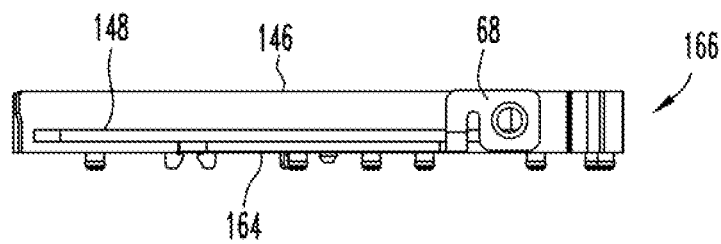
FIGS. 21-23 are similar to FIGS. 15-17 respectively but with the extender body member carrying a third embodiment grounding clip.
Figure 22:
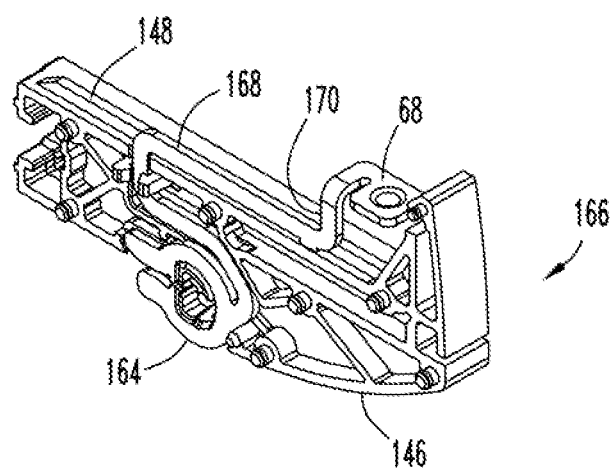
Figure 23:
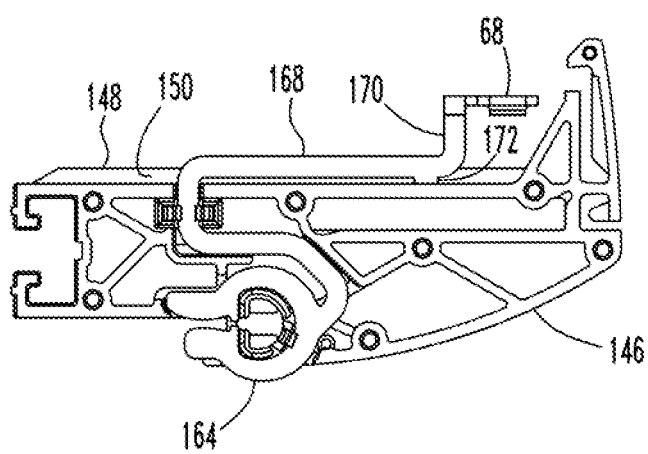
Figure 24:
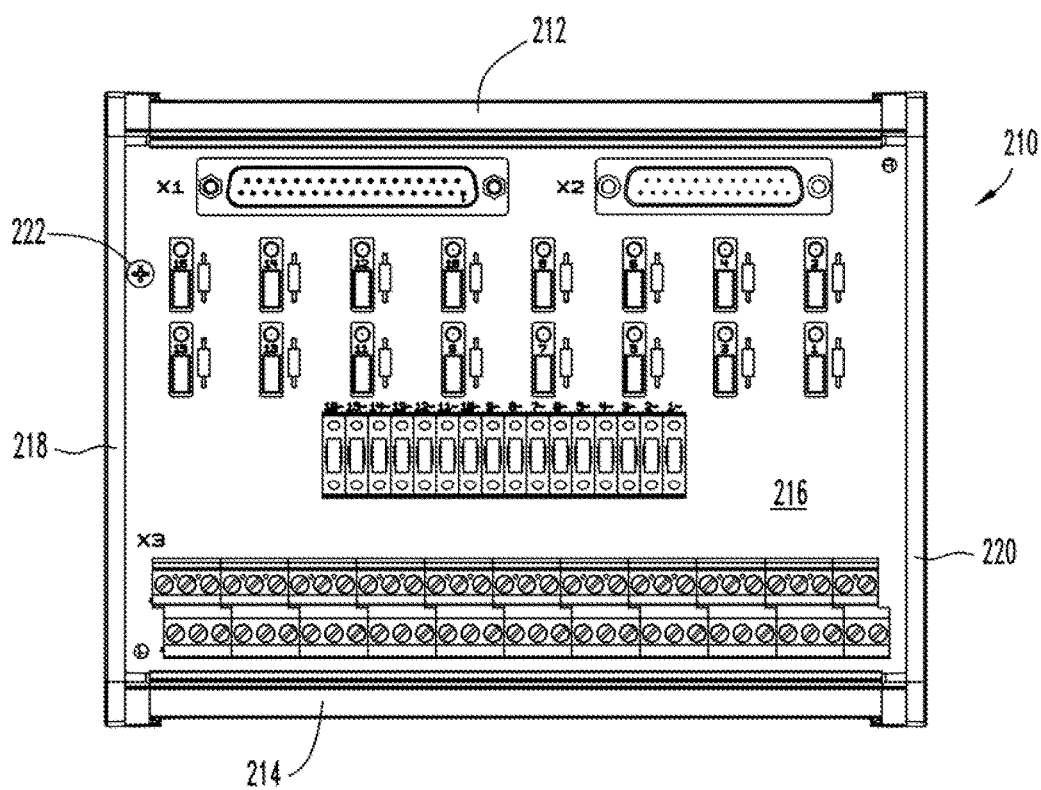
FIG. 24 illustrates a prior art housing carrying a PCB.

FIGS. 21-23 illustrate the body member 146 carrying a third embodiment grounding clip 164. The grounding clip 164 is similar to the grounding clip 12 and so only differences will be discussed.

The grounding clip 164 is designed to locate the clip electrical terminal 68 closer to the electronic component side 34 of the housing slice 10 than does the grounding clip 12. The lead portion of the grounding clip 164 exiting the slot 104 makes an immediate 90-degree bend towards the component end 166 of the body member 146 and includes a lateral arm 168 and a vertical arm 170, both arms located on the outside of the body member 146. The lateral arm 168 extends adjacent to and parallel with the abutment surface 150 from the slot 104 to the vertical arm 170 to establish the lateral position of the electrical terminal 68. The abutment surface 150 does not extend vertically beyond the upper side of the lateral arm 168. The vertical arm 170 fixes the vertical position of the electrical terminal 68 above the recess floor 42.

The lateral arm 1684 further includes an abutment member 172 near the vertical arm 170. The abutment member 172 functions similarly to the abutment member 162 and engages the floor surface 44 to maintain the lateral arm 184 parallel with the floor surface 44.

While this disclosure discloses and describes one or more embodiments, it is understood that this is capable of modification and that the disclosure is not limited to the precise details set forth, but includes such changes and alterations as fall within the purview of the following claims.

The invention claimed is:

1. A modular housing for mounting an electrical component on a grounding rail, the modular housing comprising:
    a plurality of housing slices and a pair of end covers;
    each housing slice comprising opposite sides separated by a width, a first component support extending from one side to the other side, a second component support spaced from the first component support and extending from one side to the other side, and a floor between the first and second component supports, the floor extending from one side to the other side below the first and second component supports;
    the housing slices being placed side-by-side, the housing slices being between the pair of end covers to form the modular housing, the first component supports being aligned with one another and cooperatively forming a first housing component support, the second component supports being aligned with one another and cooperatively forming a second housing component support, and the floors being aligned with one another and cooperatively forming a housing component floor being disposed below the first and second housing component supports;
    each of the housing slices being configured to enable the housing slices to be placed side-by-side in any order between the end covers to define a first housing support and a second housing support capable of mounting the electrical component against the first and second mounting supports;
    at least one of the housing slices carrying a grounding member, each at least one housing slice defining a cavity beneath the floor receiving the grounding member, the grounding member being a unitary member and comprising a grounding portion, a grounding terminal portion, and a lead portion connecting the grounding portion and the grounding terminal portion, the grounding portion being disposed to contact the grounding rail when the modular housing is mounted on the grounding rail, the lead portion extending from the cavity through the floor to the grounding terminal portion, the grounding terminal portion being disposed above the floor outside of the housing slice and not extending beyond the sides of the housing slice.

2. The modular housing of claim 1 wherein the at least one housing slice is sandwiched between a pair of housing slices, the pair of housing slices each not carrying a grounding member.

3. The modular housing of claim 1 wherein the at least one housing slice is side-by-side with one of the end covers.

4. The modular housing of claim 1 wherein the at least one housing slice comprises a pair of housing slices with grounding members, the pair of housing slices with grounding members being side-by-side with one another.

5. The modular housing of claim 1 wherein the at least one housing slice comprises a pair of housing slices with grounding members, the pair of housing slices with grounding members being spaced apart from one another by one or more housing slices without grounding members.

6. The modular housing of claim 1 wherein the at least one housing slice comprises a pair of housing slices with grounding members, the pair of housing slices with grounding members having non-identical grounding members.

7. The modular housing slice of claim 1 wherein the at least one housing slice extends in a lateral direction from a component end to a contact end, the lead portion of the grounding member being carried by the at least one housing slice extends out of a slot in the said housing slice and extends from the slot towards either the component end or the contact end of the said housing slice.

8. The modular housing of claim 1 wherein the at least one housing slice extends between a contact end and an opposite component end, the lead portion of the grounding member of the said at least one housing slice extends through a slot in the floor of the said housing slice and comprises an elongate portion on the outside of the said housing slice extending away from the slot and towards either the contact end or the component end of the housing slice.

9. The modular housing of claim 8 wherein the elongate portion of the grounding member extends along a raised surface extending along the floor of the said housing slice.

10. A housing slice body for forming at least a portion of a housing slice for being placed in a stack of housing slices for forming a modular housing that houses an electrical component and mounts the electrical component on a grounding rail, the housing slice body capable of carrying a grounding member and comprising:
    opposite sides separated by a width of the body, the body being configured to be stacked side-by-side with like housing slice bodies for defining at least part of the housing module, the body comprising alignment pins extending away from a first side of the body and corresponding pin receiving holes on an opposite second side of the body;
    the body comprising a first component support extending the width of the body and a floor extending the width of the body, the first component support being configured to cooperatively form a electrical component support capable of supporting the electrical component against the electrical component support when the body is placed in a stack of housing slices having like housing slice bodies;
    the floor being disposed below the first support surface and extending away from the first support surface, the floor comprising a surface on the outside of the body;
    the body defining a cavity open to one side of the body to receive the grounding member, the body comprising a through-slot in the floor open to the cavity and to the floor surface.

11. The housing slice body of claim 10 wherein the body comprises at least one latch arm being disposed adjacent the cavity, each latch arm having a retaining surface normally facing the cavity when unstressed.

12. The housing slice body of claim 10 wherein the body comprises an annular wall in the cavity, the wall being a non-circular wall.

13. The housing slice body of claim 12 wherein the wall comprises a latch arm forming a portion of the wall, the latch arm having a retaining surface normally facing the cavity when unstressed.

14. The housing slice body of claim 10 wherein the slot is open to the one side of the body.

15. The housing slice body of claim 10 wherein the body extends in a lateral direction between opposite ends of the body, and the body comprises a wall in the cavity extending in a lateral direction and being disposed to support a portion of a grounding member when the grounding member is disposed in the cavity.

16. The housing slice body of claim 10 wherein the body is an integral extender body member comprising half of a press-fit connection on an end of the body configured to fit with a corresponding half of a press-fit connection of a contact body member to form a housing slice.

17. The housing slice body of claim 10 wherein the body comprises one or more walls in the cavity, each wall extending to a wall end in the cavity spaced inwardly from the one side of the body.

18. The housing slice body of claim 17 wherein the grounding member is substantially flush with the one side of the body when the grounding member is in the cavity and against the wall end of each at least one wall.

19. The housing slice body of claim 10 wherein the body comprises opposite first and second ends, the body extends in a lateral direction from the first end to the second end, and the body comprises a raised elongate ridge running along the floor in the lateral direction.

20. The housing slice body of claim 19 wherein the floor comprises an edge defining an end of the slot spaced from the one side of the housing slice, the ridge extending along the edge of the slot.

21. The housing slice body of claim 20 wherein the ridge extends between opposite ends, the slot being disposed between the ends of the ridge.

* * * * *